(12) United States Patent
Abdo

(10) Patent No.: US 10,276,771 B2
(45) Date of Patent: Apr. 30, 2019

(54) INCORPORATING ARRAYS OF JOSEPHSON JUNCTIONS IN A JOSEPHSON JUNCTION RING MODULATOR IN A JOSEPHSON PARAMETRIC CONVERTER

(71) Applicant: INTERNATIONAL BUSINESS MACHINES CORPORATION, Armonk, NY (US)

(72) Inventor: Baleegh Abdo, Carmel, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/002,659

(22) Filed: Jun. 7, 2018

(65) Prior Publication Data

US 2018/0277733 A1    Sep. 27, 2018

Related U.S. Application Data

(63) Continuation of application No. 15/581,934, filed on Apr. 28, 2017, now Pat. No. 10,062,828, which is a
(Continued)

(51) Int. Cl.
| | | |
|---|---|---|
| *H01L 39/24* | (2006.01) | |
| *H01L 39/02* | (2006.01) | |
| *G06N 99/00* | (2019.01) | |
| *H03K 17/92* | (2006.01) | |
| *H01L 39/22* | (2006.01) | |
| *H01P 5/19* | (2006.01) | |
| *B82Y 10/00* | (2011.01) | |
| *H01L 39/04* | (2006.01) | |
| *H03D 7/00* | (2006.01) | |
| *H01L 27/18* | (2006.01) | |

(52) U.S. Cl.
CPC ......... *H01L 39/025* (2013.01); *G06N 99/002* (2013.01); *H01L 39/223* (2013.01); *H01L 39/2493* (2013.01); *H01P 5/19* (2013.01); *H03K 17/92* (2013.01); *B82Y 10/00* (2013.01); *H01L 27/18* (2013.01); *H01L 39/045* (2013.01); *H03D 7/005* (2013.01)

(58) Field of Classification Search
None
See application file for complete search history.

(56) References Cited

U.S. PATENT DOCUMENTS 7,570,075 B2   8/2009 Gupta et al.
7,724,083 B2   5/2010 Herring et al.
(Continued)

OTHER PUBLICATIONS

Notice of Allowance dated Feb. 27, 2018 for U.S. Appl. No. 15/582,102.
(Continued)

*Primary Examiner* — Jeffery S Zweizig
(74) *Attorney, Agent, or Firm* — Tutunjian & Bitetto, P.C.; Vazken Alexanian

(57) ABSTRACT

A Josephson parametric converter is provided. The Josephson parametric converter includes a multi-Josephson junction ring modulator having arrays of Josephson junctions arranged in a ring configuration with nodes inter-dispersed between the arrays. The Josephson parametric converter includes resonators formed from capacitors that shunt the multi-Josephson junction ring modulator and enable respective modes of the Josephson parametric converter.

20 Claims, 3 Drawing Sheets

Related U.S. Application Data continuation of application No. 14/754,154, filed on Jun. 29, 2015, now Pat. No. 9,697,473.

(56) References Cited

U.S. PATENT DOCUMENTS

| | | | |
|---|---|---|---|
| 7,932,514 | B2 | 4/2011 | Farinelli et al. |
| 8,169,231 | B2 | 5/2012 | Berkley |
| 8,861,619 | B2 | 10/2014 | McDermott et al. |
| 2018/0040935 | A1 | 2/2018 | Silwa et al. |

OTHER PUBLICATIONS

Abdo, et al., "Josephson Amplifier for Qubit Readout", Department of Applied Physics, Yale University, New Haven, Connecticut, Feb. 2012, 3 pages.

Abdo, et al., "Nondegenerate Three-wave Mixing with the Josephson Ring Modulator, Department of Applied Physics", Yale University, New Haven, Connecticut, Jan. 2013, 18 pages.

Abdo, et al., "Full Coherent Frequency Conversion between Two Propagating Microwave Modes" Department of Applied Physics, Yale University, New Haven, Connecticut, Apr. 2013, 5 pages.

Bergeal et al., "Phase-preserving Amplification Near the Quantum Limit with a Josephson Ring Modulator", vol. 465|6, May 2010, pp. 64-69.

Narla et al., "Wireless Josephson Amplifier", Department of Applied Physics, Yale University, New Haven, Connecticut, May 2014, 5 pages.

Roch, et al., "Widely Tunable, Nondegenerate Three-Wave Mixing Microwave Device Operating near the Quantum Limit", American Physical Society, Apr. 2012, 5 pages.

Apr. 28, 2017, U.S. Appl. No. 15/582,102, US 2017-0229633 A1.
Apr. 28, 2017, U.S. Appl. No. 15/581,998, US 2017-0229632 A1.
Apr. 28, 2017, U.S. Appl. No. 15/581,934, US 2017-0229631 A1.
Jun. 29, 2015, U.S. Appl. No. 14/754,154, US-2017-0039481 A1.

INCORPORATING ARRAYS OF JOSEPHSON JUNCTIONS IN A JOSEPHSON JUNCTION RING MODULATOR IN A JOSEPHSON PARAMETRIC CONVERTER

BACKGROUND

Technical Field

The present invention relates generally to electronic devices and, in particular, to incorporating arrays of Josephson junctions in the Josephson ring modulators which constitute the nonlinear dispersive medium in Josephson parametric converters.

Description of the Related Art

A Josephson ring modulator (JRM) is a nonlinear dispersive element based on Josephson tunnel junctions that can perform three-wave mixing of microwave signals at the quantum limit. The JRM consists of Josephson Junctions (JJs). In order to construct a non-degenerate parametric device that is the Josephson parametric converter (JPC), which is capable of amplifying and/or mixing microwave signals at the quantum limit, the JRM is incorporated into two microwave resonators at an RF-current anti-node of their fundamental Eigenmodes. As has been demonstrated in several experimental and theoretical works, the performances of these JPCs, namely power gain, dynamical bandwidth, and dynamic range, are strongly dependent on the critical current of the JJs of the JRM, the specific realization of the electromagnetic environment (i.e., the microwave resonators), and the coupling between the JRM and the resonators.

SUMMARY

According to an aspect of the present invention, a Josephson parametric converter is provided. The Josephson parametric converter includes a multi-Josephson junction ring modulator having arrays of Josephson junctions arranged in a ring configuration with nodes inter-dispersed between the arrays. The Josephson parametric converter includes resonators formed from capacitors that shunt the multi-Josephson junction ring modulator and enable respective modes of the Josephson parametric converter.

According to another aspect of the present invention, a method is provided. The method includes forming a Josephson parametric converter. The forming step includes forming a multi-Josephson junction ring modulator having arrays of Josephson junctions arranged in a ring configuration with nodes inter-dispersed between the arrays. The forming step further includes forming resonators from capacitors that shunt the multi-Josephson junction ring modulator and enable respective modes of the Josephson parametric converter.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
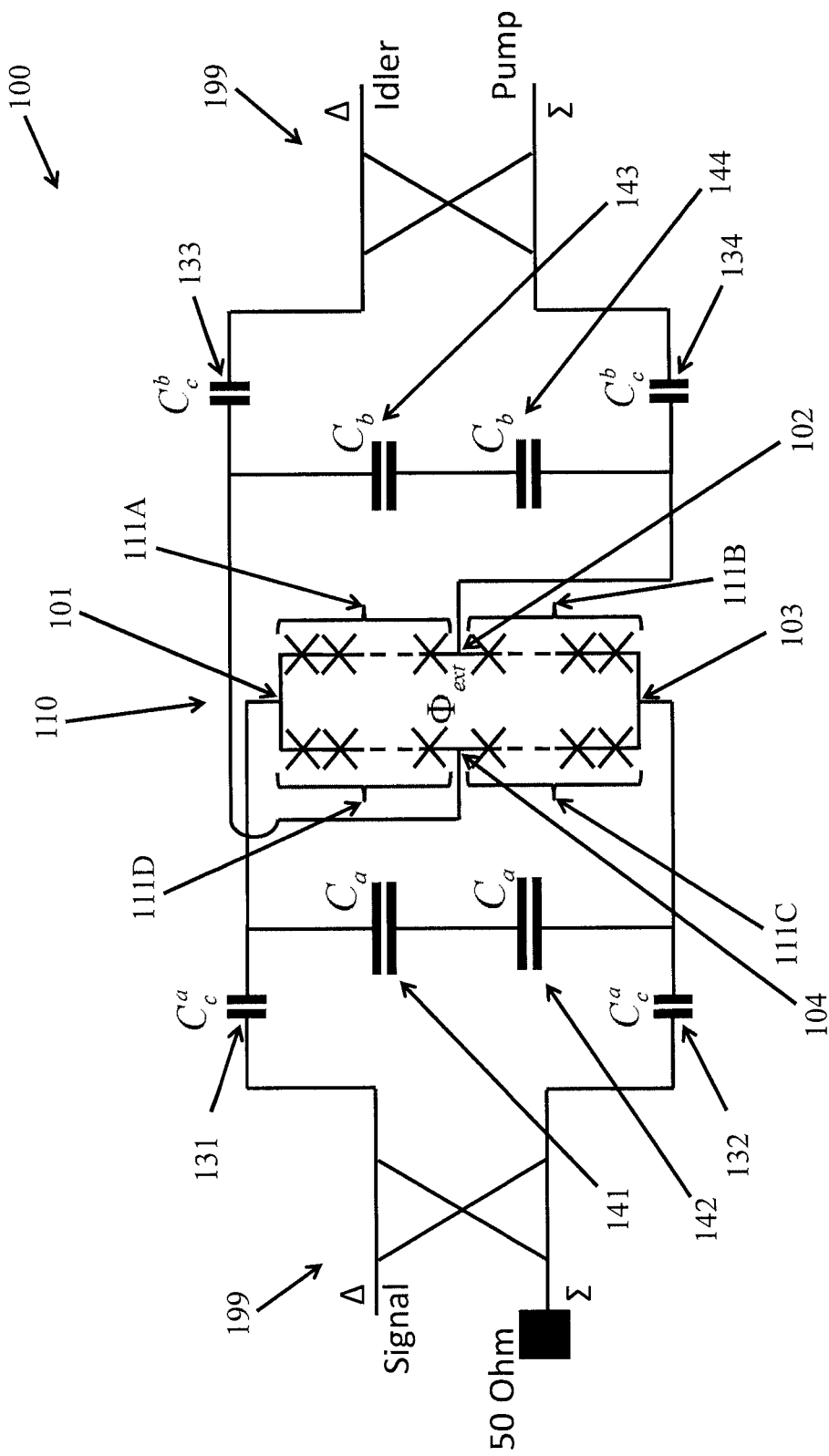
FIG. 1 shows an exemplary circuit for a Josephson Parametric Converter (JPC) 100, in accordance with an embodiment of the present principles.

The present principles are directed to incorporating arrays of Josephson Junctions in Josephson Ring Modulators (JRMs) which form the nonlinear dispersive medium in Josephson Parametric Converters (JPCs).

In an embodiment, we replace four Josephson Junctions (JJs), which form a conventional standard JRM, with an array of large junctions (having large critical current) in each arm (larger than 1, e.g., between 2 and 15). In an embodiment, we also modify the electromagnetic environment in support of the new JRM. In an embodiment, we propose using lumped-element capacitances which form, in conjunction with the inductance of the JRM, the necessary microwave resonators of the JPC.

By introducing the changes described herein to JPCs, we aim at enhancing two main performances of JPCs, namely the dynamical bandwidth and the dynamic range of the JPCs. Conventional JPC devices suffer from a relatively low dynamical bandwidth on the order of 10 MHz and a maximum input power of a few photons at the signal frequency per dynamical bandwidth at 20 dB of gain. Enhancing these two figures of merit by at least an order of magnitude is critical so that JPCs can be applicable for scalable qubit readout architectures. In an embodiment, we can provide a larger dynamic range (×10-100) due to stiffer pump and also by employing arrays of JJs in the Josephson Junction Ring Modulators (JRMs). In an embodiment, we can provide a larger dynamical bandwidth >100 MHz (by increasing the participation ratio of the ring). Another important advantage of the proposed new device with regard to scalability is its small footprint. Compared with microstrip JPCs for instance the size of the new device is expected to be about 300 times smaller.

To understand how this new configuration can enhance the dynamical bandwidth of JPCs, it is important to note that one of the limitations on the amplifier bandwidth is what is known as the pQ product, where Q is the total quality factor of the resonators and p is the participation ratio of the device (i.e., the ratio between the effective inductance of the ring to the total inductance of the device). In order for the JPC to work properly, the pQ product of the device should be much larger than unity. In microstrip resonators, the participation ratio is relatively low on the order of a few percent, therefore in order to satisfy the pQ product limitation, the Q of the resonators should be relatively "large" on the order of 100. Hence, in order to enhance the bandwidth of the device, we suggest dominating the total inductance of the device via the ring contribution while maintaining a large critical current at the same time, which should allow us to lower Q by a factor of 10 or more and consequently obtain a dynamical bandwidth on the order of 100 MHz at 20 dB of gain.

As to the dynamic range figure, the proposed device is expected to have enhanced performance for two reasons. One, the fact that the resonators in this new configuration would be made out of lumped-elements, which lack any resonance close in frequency to the pump tone driving the device, makes the pump drive stiffer than existing designs (especially microstrip JPCs) and therefore boosts the dynamic range of the device. Two, substituting the single large JJ in each arm of the JRM with an array of large JJs (having the same critical current as the single JJ) would increase the maximum RF-voltage difference that can be applied across the array compared to the single junction case. As a consequence, the maximum circulating power that can be handled by the proposed Multi-JJ ring modulator (MJRM) is expected to be larger. In other words, the addition of arrays of JJs is expected to decrease the nonlinearity of the JRM by decreasing the coupling constant of the three-wave mixing medium (i.e. the JRM), and as a result require driving it with higher pump powers in order to achieve the same gains. In summary, the incorporation of arrays of large Josephson junctions in the Josephson junction ring modulator in conjunction with using lumped-element implementations for the resonators, should enhance the maximum input power (i.e., dynamic range) of Josephson parametric converters to more than −120 dBm at 20 dB of gain.

FIG. 1 shows an exemplary circuit for a Josephson Parametric Converter (JPC) 100, in accordance with an embodiment of the present principles.

The JPC 100 includes a Multi-JJ ring modulator (MJRM) 110. The MJRM 110 includes four nodes 101, 102, 103, and 104. The MJRM 110 further includes four arrays of N Josephson junctions 111A, 111B, 111C, and 111D arranged in a Wheatstone Bridge-like configuration with respect to the four nodes 101-104 (that is, in a ring configuration with the nodes 101-104 inter-dispersed between the arrays 111A-111D), where array 111A is between nodes 101 and 102, array 111B is between nodes 102 and 103, array 111C is between nodes 103 and 104, and array 111D is between nodes 104 and 101. The N Josephson junctions in each of the arrays 111A-D are connected in series, where N is an integer larger than one. The arrays 111A-D form a superconducting loop threaded by a magnetic flux $\Phi_{ext}$. In an embodiment, the flux bias applied to the ring is half a flux-quantum.

The JPC 100 also includes 2 resonators denoted as a and b. The resonators are formed by shunting opposite nodes of the MJRM 110 with lumped-element capacitors 141-144. Thus, nodes 101 and 103 are shunted with lumped-element capacitors $C_a$ 141 and $C_a$ 142, and nodes 102 and 104 are shunted with lumped-element capacitors $C_b$ 143 and $C_b$ 144. Capacitor $C_a$ 141 and capacitor $C_a$ 142 are connected in series with respect to each other, and capacitor $C_b$ 143 and capacitor $C_b$ 144 are connected in series with respect to each other. Each resonator is connected to two feedlines either directly or through coupling capacitors. Resonator a is connected to two feedlines, which form the signal (S) port, via lumped-element capacitors $C_c^a$ 131 and $C_c^a$ 132. Each feedline is connected to one output port of the hybrid 199. Resonator b is connected to two feedlines, which form the idler (I) port, via lumped-element capacitors $C_c^b$ 133 and $C_c^b$ 134. Each feedline is connected to one output port of the hybrid 199. The resonance frequencies (differential Eigenmodes) of the JPC in this configuration are mainly determined by the shunt capacitances 141-144 ($C_a$ 141, $C_a$ 142, $C_b$ 143, and $C_b$ 144), the linear inductance of the MJRM 110, the coupling capacitors 131-134 ($C_c^a$ 131, $C_c^a$ 132, $C_c^b$ 133, and $C_c^b$ 134), and the characteristic impedances of the feedlines. Without loss of generality, we refer to microwave tones that lie within the bandwidths of resonators a and b as signal (S) and (I) tones, respectively and, therefore, refer to the physical port connected to resonator a as the signal port and the physical port connected to resonator b as the idler port. We further assume, without loss of generality, that the resonance frequency of resonator b is larger than the resonance frequency of resonator a.

In JPC 100, two 180 degree hybrid couplers 199 (also interchangeably referred to as "hybrids" in short) are used, one on the left side and one on the right side as shown. Each of the hybrids functions as a power divider with two input ports and two output ports. A microwave signal that enters the difference port of the hybrid is split in half. Half of the signal power exits on one output port of the hybrid while the other half exits on the other output port of the hybrid. However, the phase difference between these two output signals is 180 degrees (hence, the term "difference port"). A microwave signal that enters the sum port is also split in half in the same manner, but the phase difference between the output signals is zero (the phases are equal). In FIG. 1, the output ports of the hybrids are connected to the coupling capacitors 131, 132, 133, and 134. Based on the preceding, microwave signals that are fed through the sum and difference ports of the hybrid are coupled to the device through both output ports of the hybrid.

The signal (S) and the idler (I) tones represent microwave signals that lie within the dynamical bandwidths of resonators a and b of the JPC 100 respectively. The signal (S) tone is fed through the difference port ($\Delta$) of an 180° hybrid coupler 199. The idler (I) tone is fed through the difference port ($\Delta$) of another 180° hybrid coupler 199. A third tone, denoted as pump (P), is non-resonant and is input to the MJRM 110 via the sum port ($\Sigma$) of one of the 180° hybrid couplers 199 connected to either side of the device. The unused sum port ($\Sigma$) of the second hybrid 199 is connected to a 50 Ohm termination. Both the signal (S) and the idler (I) excite the MJRM differentially, while the pump (P) is a common-mode drive. Thus, the signal (S) and the idler (I) couple to the differential modes of the MJRM 110, while the pump (P) couples to the common-mode of the MJRM 110. The frequency of the signal (S) tone is $f_S$, the frequency of the idler (I) tone is $f_I$, and the frequency of the pump drive is set to either the sum or the difference of $f_S$ and $f_I$.

The proposed MJRM also covers the variation in which it allows the resonance frequencies of resonators a and b to be tuned by varying the applied flux threading the MJRM loop. One way to achieve that is by shunting each array of N JJs by linear inductance which satisfies the condition $N*L_J/4<L<N*L_J/2$, where L is the linear inductance of the shunt, N is the number of JJs in the array, and $L_J$ is the linear inductance of each JJ in the array at the working point (i.e., the applied flux threading the MJRM). The linear shunt inductance L can be implemented using narrow superconducting wires, or array of large JJs.

Figure 2:
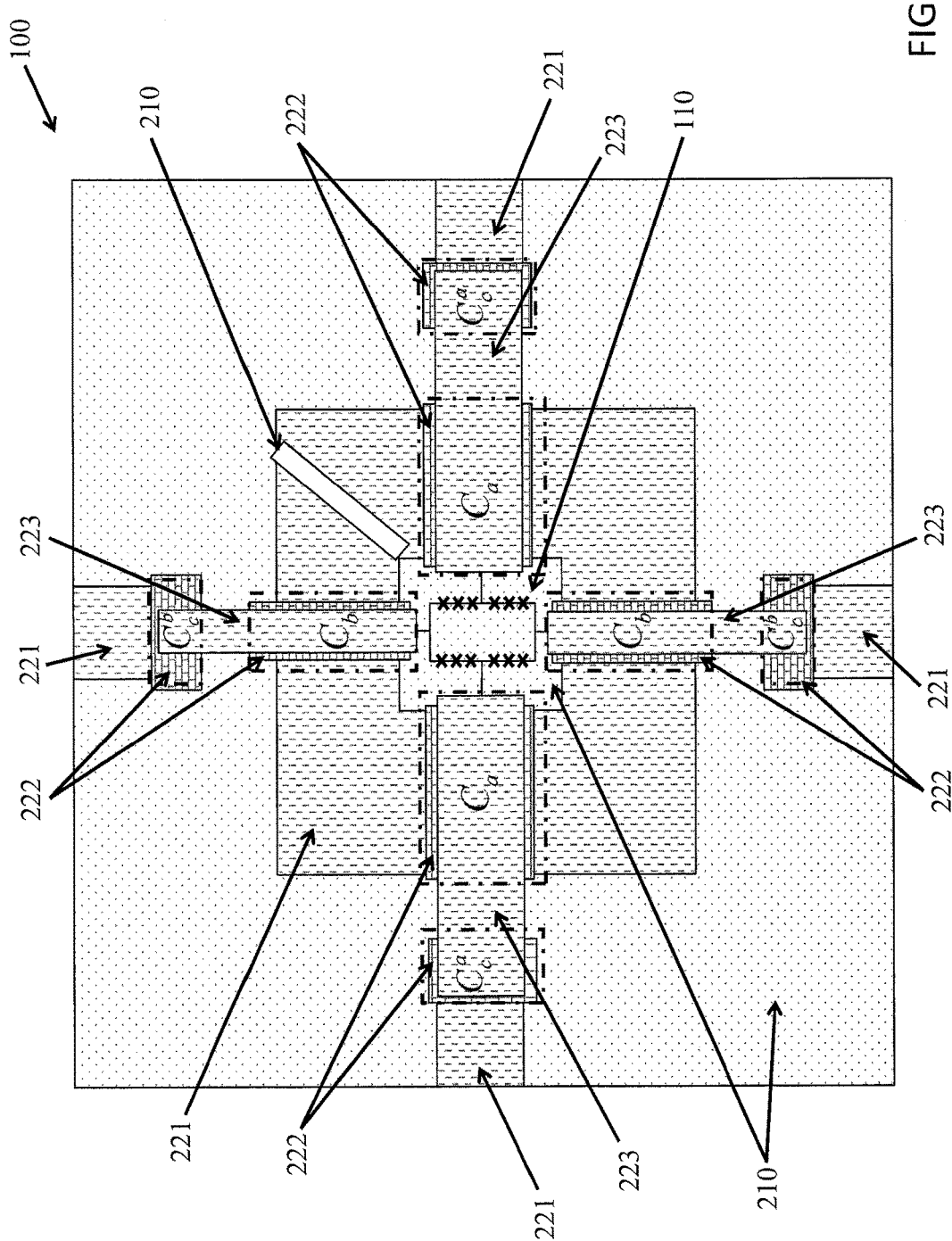
FIG. 2 an exemplary implementation layout for the Josephson Parametric Converter (JPC) 100 of FIG. 1, in accordance with an embodiment of the present principles.

FIG. 2 an exemplary implementation layout for the Josephson Parametric Converter (JPC) 100 of FIG. 1, in accordance with an embodiment of the present principles.

The JPC 100 includes a dielectric substrate 210 on which the MJRM 110 is disposed. Further on the dielectric substrate 210, a superconductor layer (hereinafter "superconductor" in short) 221 is arranged to encompass the periphery of the MJRM 110. A cut or gap 210 is provided in the superconductor 221 for proper operation of the JPC 100. In further detail, the cut 210 is provided to prevent any loops in superconductor layer 221. That is, superconductor layer 221 is not continuous and, hence, does not include a closed loop. Thus, no current is able to circulate in layer 221.

On the superconductor 221, eight low-loss dielectrics 222 are provided as follows and as shown in FIG. 2. Four low-loss dielectrics 222 are provided in the middle portion of JPC 100 around MJRM 110 to implement capacitors $C_a$ 141, $C_a$ 142, $C_b$ 143, and $C_b$ 144. Four low-loss dielectrics 222 are provided on the sides to implement coupling capacitors. It is to be appreciated that in other embodiments, the dielectric layer in the middle section (four low-loss dielectrics 222) can cover the whole periphery of the MJRM 110 on top of the superconductor 221 without affecting the performance of the JPC 100. Eventually, what defines the plate capacitors is the overlap between the upper and bottom electrodes. On at least portions of the eight low-loss dielectrics 222, superconductors 223 are disposed. Superconductors 223 implement the top electrode of capacitors $C_a$ 141, $C_a$ 142, $C_b$ 143, $C_b$ 144, $C_c^a$ 131, $C_c^a$ 132, $C_c^b$ 133, and $C_c^b$ 134. Superconductors 223 also connect one end of $C_c^a$ 131 to one end of $C_a$ 141, one end of $C_c^a$ 132 to one end of $C_a$ 142, one end of $C_c^b$ 133 to one end of $C_b$ 143, and one end of $C_c^b$ 134 to one end of $C_b$ 144. The MJRM 110 is connected to the superconductors 223. The superconductors 221 implement the superconducting feedlines (transmission lines) for the 3 Eigenmodes of the JPC 100. The device feedlines that connect to the output ports of the hybrids (which are shown in FIG. 1) are in superconductor layer 221.

Figure 3:
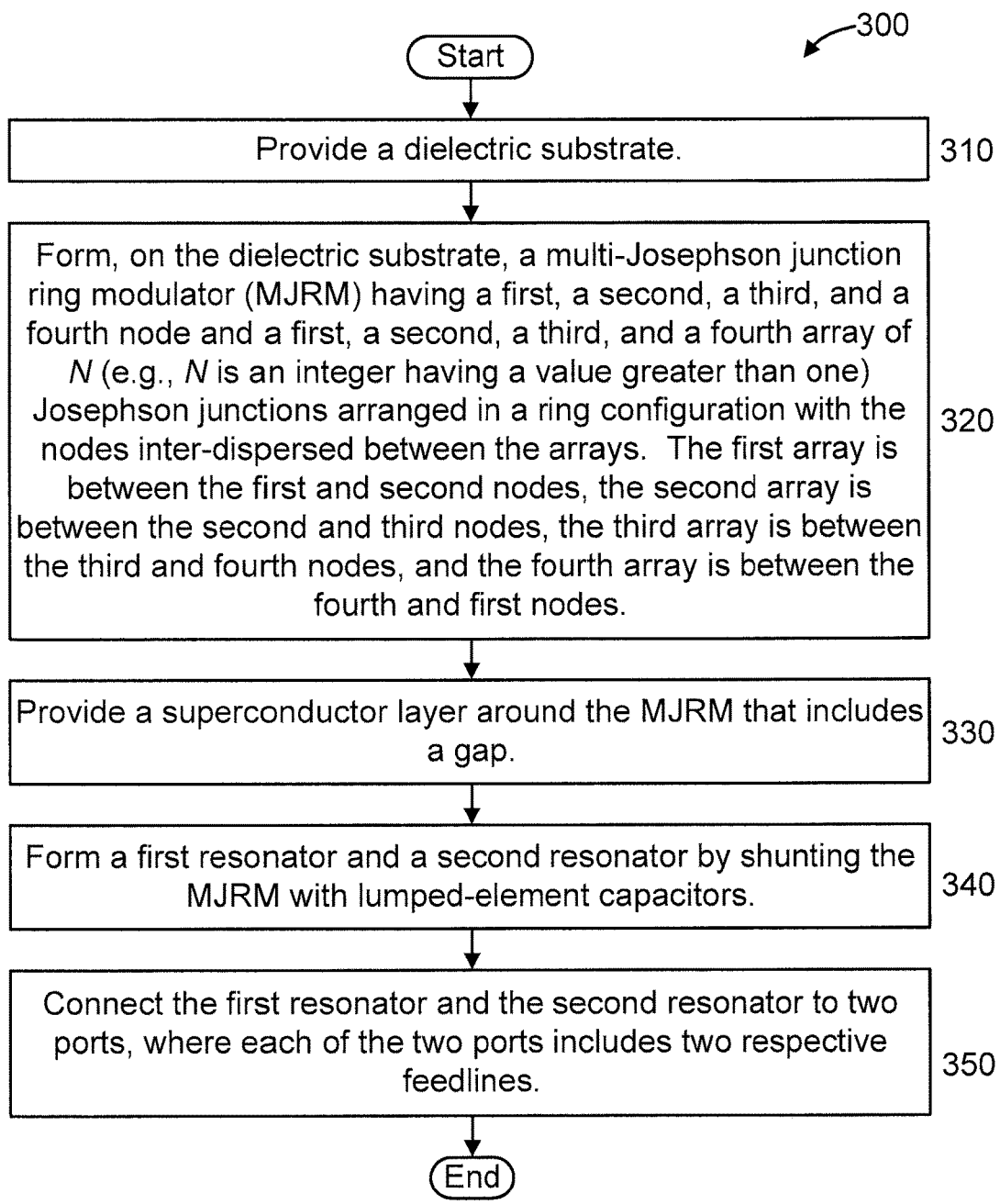
FIG. 3 shows an exemplary method 300 for forming a Josephson Parametric Converter (JPC) 100, in accordance with an embodiment of the present principles.

FIG. 3 shows an exemplary method 300 for forming a Josephson Parametric Converter (JPC) 100, in accordance with an embodiment of the present principles. It is to be appreciated that one or more steps have been omitted from method 300 for the sake of brevity, but are readily apparent to one of ordinary skill in the art given the teachings of the present principles provided herein.

At step 310, provide a dielectric substrate.

At step 320, form, on the dielectric substrate, a multi-Josephson junction ring modulator having a first, a second, a third, and a fourth node and a first, a second, a third, and a fourth array of N Josephson junctions arranged in a ring configuration with the nodes inter-dispersed between the arrays. The first array is between the first and second nodes, the second array is between the second and third nodes, the third array is between the third and fourth nodes, and the fourth array is between the fourth and first nodes. In an embodiment, N is an integer having a value greater than one.

At step 330 provide a superconductor layer around the MJRM that includes a gap. In an embodiment, the superconductor layer is provided, for example, using any layer deposition process, and then the gap is made, for example, using any known process including, but not limited to etching.

At step 340, form a first resonator and a second resonator by shunting the MJRM with lumped-element capacitors.

At step 350, connect the first resonator and the second resonator to two ports, where each of the two ports includes two respective feedlines.

A description will now be given regarding some exemplary applications to which the present principles can be applied.

The present principles can be used in the readout of solid state qubits such as superconducting qubits and quantum dots. For example, the present principles can be used to enhance the measurement fidelity, and allow for scalable readout architectures. The present principles can also be used, in general, to perform sensitive quantum measurements in the microwave domain, such as measuring nanomechanical systems coupled to microwave resonators.

The present principles can be used in building wideband, large input power quantum-limited Josephson directional amplifiers and also on-chip dissipationless circulators. The present principles can be used (similar to Josephson parametric converters but with enhanced performance) as ideal microwave mixers (performing upconversion and downconversion of microwave frequency without dissipation), controllable microwave beam-splitters, and fast, lossless microwave switches.

The present principles can also find some applications in improving the sensitivity of microwave measurements in the areas of astronomy and cosmology.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A Josephson parametric converter, comprising:
a multi-Josephson junction ring modulator having arrays of Josephson junctions arranged in a ring configuration with nodes inter-dispersed between the arrays; and
resonators formed from capacitors that shunt the multi-Josephson junction ring modulator and enable respective modes of the Josephson parametric converter.

2. The Josephson parametric converter of claim 1, wherein the Josephson junctions in each of the arrays are connected in series.

3. The Josephson parametric converter of claim 1, wherein the resonators comprise a first and a second resonator, the first resonator comprising at least one of the capacitors shunted across a first node and a third node from among the nodes, and the second resonator comprising at least another one of the capacitors shunted across a second node and a fourth node from among the nodes.

4. The Josephson parametric converter of claim 3, wherein multi-Josephson junction ring modulator has two opposing pairs of nodes, a first of the two opposing pairs of nodes formed from the first node and the third node, and a second of the two opposing pairs of nodes formed from the second node and the fourth node.

5. The Josephson parametric converter of claim 1, further comprising a first, a second, a third, and a fourth coupling capacitor, each having a first electrode connected to a respective different one of the nodes of the multi-Josephson junction ring modulator, and having a second electrode for connecting to a respective one of a plurality of feedlines.

6. The Josephson parametric converter of claim 1, wherein the Josephson parametric converter is formed such that a total inductance of the Josephson parametric converter is dominated by an inductance contribution of the multi-Josephson junction ring modulator to provide a dynamical bandwidth of at least 100 MHz for the Josephson parametric converter at 20 dB of gain.

7. The Josephson parametric converter of claim 1, wherein the resonators are further formed from lumped-element inductance, and wherein the arrays of Josephson junctions in the Josephson junction ring modulator in conjunction with using a lumped-element implementation for the resonators enables a maximum input power of at least −120 dBm at 20 dB of gain for the Josephson parametric converter, wherein the lumped-element implementation for the resonators comprises the lumped-element inductance and the capacitors implemented as lumped-element capacitors.

8. The Josephson parametric converter of claim 1, wherein a number of the nodes in the ring arrangement is four.

9. The Josephson parametric converter of claim 1, wherein the Josephson parametric converter is configured to perform wave mixing of three microwave signals for quantum information processing.

10. The Josephson parametric converter of claim 9, wherein the Josephson parametric converter is configured to selectively perform unitary frequency conversion or quantum-limited amplification in a microwave domain based on a pump tone frequency.

11. A method, comprising:
forming a Josephson parametric converter, wherein said forming step includes:
forming a multi-Josephson junction ring modulator having arrays of Josephson junctions arranged in a ring configuration with nodes inter-dispersed between the arrays; and
forming resonators from capacitors that shunt the multi-Josephson junction ring modulator and enable respective modes of the Josephson parametric converter.

12. The method of claim 11, wherein the Josephson junctions in each of the arrays are connected in series.

13. The method of claim 11, wherein forming the resonators comprises:
shunting at least one of the capacitors across a first node and a third node from among the nodes; and
shunting at least another one of the capacitors across a second node and a fourth node from among the nodes.

14. The method of claim 13, wherein multi-Josephson junction ring modulator is formed to have two opposing pairs of nodes, a first of the two opposing pairs of nodes formed from the first node and the third node, and a second of the two opposing pairs of nodes formed from the second node and the fourth node.

15. The method of claim 11, further comprising forming a first, a second, a third, and a fourth coupling capacitor, each having a first electrode connected to a respective different one of the nodes of the multi-Josephson junction ring modulator, and having a second electrode for connecting to a respective one of a plurality of feedlines.

16. The method of claim 11, wherein the Josephson parametric converter is formed such that a total inductance of the Josephson parametric converter is dominated by an inductance contribution of the multi-Josephson junction ring modulator to provide a dynamical bandwidth of at least 100 MHz for the Josephson parametric converter.

17. The method of claim 11 wherein the first and the second resonator are further formed from lumped-element inductance, and wherein the arrays of Josephson junctions in the Josephson junction ring modulator in conjunction with using a lumped-element implementation for the resonators enables a maximum input power of at least −120 dBm at 20 dB of gain for the Josephson parametric converter, wherein the lumped-element implementation for the resonators comprises the lumped-element inductance and the capacitors implemented as lumped-element capacitors.

18. The method of claim 11, wherein a number of the nodes in the ring arrangement is four.

19. The method of claim 11, wherein the Josephson parametric converter is configured to perform wave mixing of three input waves for quantum information processing.

20. The method of claim 19, wherein the Josephson parametric converter is configured to selectively perform unitary frequency conversion or quantum-limited amplification in a microwave domain based on a pump tone frequency.

* * * * *